United States Patent [19]

Schmid et al.

[11] 4,256,530
[45] Mar. 17, 1981

[54] CRYSTAL GROWING

[75] Inventors: Frederick Schmid, Marblehead; Chandra P. Khattak, Danvers, both of Mass.

[73] Assignee: Crystal Systems Inc., Salem, Mass.

[21] Appl. No.: 967,114

[22] Filed: Dec. 7, 1978

[51] Int. Cl.³ .................. C30B 9/04; C30B 11/00; C30B 15/00
[52] U.S. Cl. .................. 156/600; 156/616 R; 156/617 SP; 156/DIG. 64; 156/DIG. 83
[58] Field of Search .............. 156/DIG. 83, DIG. 64, 156/608, 617 R, 617 M, 617 V, 617 SP, 600, 616 R, 616 A; 422/248

[56] References Cited
U.S. PATENT DOCUMENTS
3,265,528  8/1966  Bond .................. 156/DIG. 83

Primary Examiner—Frank Sever

[57] ABSTRACT

In the growing of crystals, the formation of carbide contaminants is prevented by eliminating direct silica-graphite contact.

13 Claims, 2 Drawing Figures

CRYSTAL GROWING

The invention described herein was made in the performance of work under NASA Contract Number NAS 7-100, JPL No. 954,373 and is subject to the provisions of Section 305 of the National Aeronautics and Space Act of 1958 (72 Stat. 435; 42 U.S.C. 2457).

FIELD OF THE INVENTION

This invention relates to growing crystals, particularly of silicon, in vacuum environment.

BACKGROUND OF THE INVENTION

In the past, silicon crystals have been grown from the melt using both the well-known Czochralski crystal growth process and, more recently, the Heat Exchanger Method of crystal growth described in U.S. Pat. Nos. 3,653,432 and 3,898,051 (both of which patents are hereby incorporated by reference). In such processes, serious problems of silicon carbide impurity have been encountered when attempting to grow crystals at pressures below about 30 torr.

SUMMARY OF THE INVENTION

It has been discovered that, at pressures below about 30 torr and at the relatively high temperatures present during crystal growth, (for silicon, typically above 1685° K.), the silica crucible and surrounding graphite retainer generally used in silicon crystal growth react to form carbon monoxide (CO). The gaseous carbon monoxide is transported into the crucible where it contacts the silicon and forms silicon carbide (SiC), since silicon carbide is more stable than carbon monoxide. The unwanted silicon carbide contaminant can cause breakdown of crystallinity and incorporate carbon in silicon. The problem of carbon monoxide formation will be present whenever silica and graphite (carbon) are in contact; and unwanted carbide contaminants will result if the carbide of the crystal being grown is more stable than carbon monoxide.

It has further been discovered that the problem of unwanted carbide contaminants can be overcome by using molybdenum or some other refractory material that is free of elemental carbon, in place of graphite, to support the silica crucible or between the silica crucible and graphite retainer; or by coating the exterior of the crucible or interior of the retainer with refractory material. Either makes it possible to avoid direct silica-graphite (carbon) contact within the furnace.

DESCRIPTION OF THE PREFERRED EMBODIMENT

Figure 1:
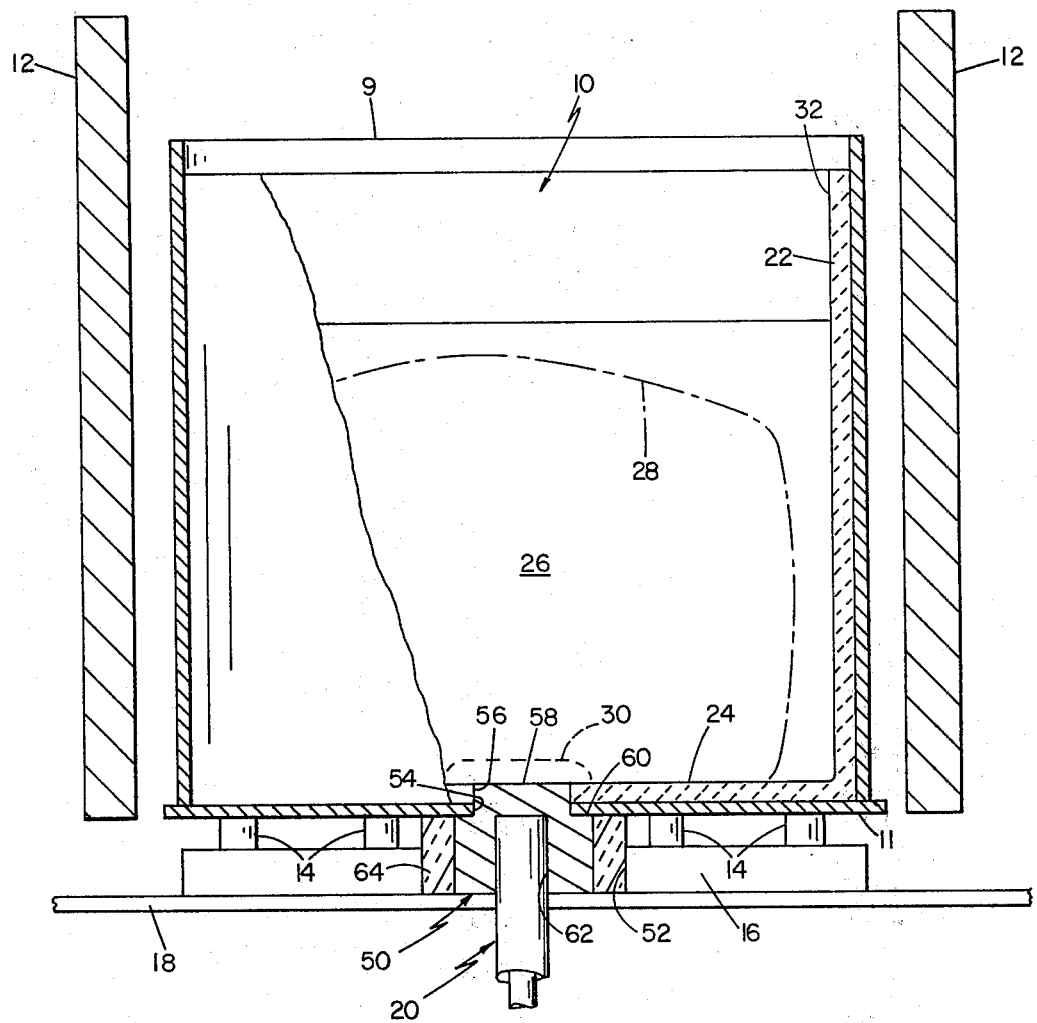
Figure 2:
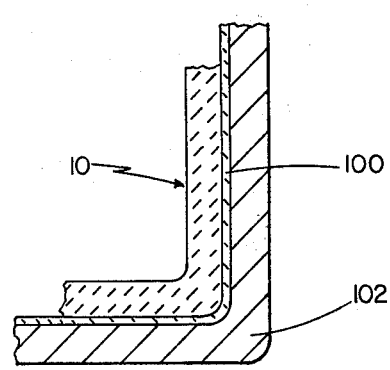

Objects, features and advantages of the invention will appear from the following detailed description of the structure and use of a preferred practice thereof, taken together with the attached drawing in which:

FIG. 1 is a schematic view, partially in section, of a crucible, molybdenum retainer, conducting graphite plug, and insulation within the heating chamber of a casting furnace; and FIG. 2 is a view of portions of a modified embodiment.

Referring now to FIG. 1, it illustrates a silica crucible 10 within the cylindrical heating chamber defined by the resistance heater 12 of a casting furnace of the type disclosed in U.S. Pat. No. 3,898,051. The crucible 10 rests on a molybdenum disc 11 which itself is supported by graphite rods 14 mounted on a graphite support plate 16 on the bottom 18 of the heating chamber, and is surrounded by a cylindrical molybdenum retainer 9. A helium cooled molybdenum heat exchanger 20, of the type disclosed in U.S. Pat. No. 3,653,432, extends through openings in the center of the plate 16 and bottom 18.

Crucible 10 is about 6 in. (15 cm.) in height and diameter and its cylindrical wall 22 and base 24 are 0.15 in. (3.7 mm.) thick. Molybdenum disc 11 is about 0.040 in. (1 mm.) thick, and molybdenum retainer 9, comprising a sheet of the same thickness rolled into cylindrical form, engages the exterior of cylinder wall 22. A silicon ingot 26, partially solidified according to the process described in aforementioned U.S. Pat. No. 3,898,051 is shown within the crucible. The solid-liquid interface 28 has advanced from the seed (shown in dashed lines at 30) so that there is a thin annulus of liquid between it and the crucible wall (the temperature of which is above the melting point of silicon), and also liquid above it. When substantially all the liquid has been solidified, the temperature of the crucible wall will be permitted to drop below the silicon melting temperature, and the crucible and solidified ingot will then be cooled.

A stepped cylindrical graphite plug 50 (upper portion diameter 1.9 in., and lower portion diameter 2.5 in.) extends from bottom 18 upwardly through coaxial holes 52, 54, 56 in, respectively, plate 16, molybdenum disc 11 and crucible base 24. The top 58 of plug 50 is flush with the inside bottom surface of crucible base 24. The seed 30 is placed over the plug 50 and the adjacent portion of crucible bottom 24 so as to cover opening 56. The exterior of the plug upper portion fits loosely in openings 54, 56 to allow for thermal expansion; and the step 60 between the plug's upper smaller diameter and lower larger diameter portions engages the underside of plate 11. A small quantity of silicon powder is placed in the area of opening 56 where seed 30, crucible 10 and graphite plug 50 are in proximity. Heat exchanger 20 fits within a coaxial recess 62 in the bottom of plug 50, with the top of the heat exchanger about ⅛ in. below the top 58 of the plug. A graphite felt insulation and/or molybdenum heat shield sleeve 64 closely surrounds the larger diameter portion of plug 50, extending axially of the plug the full distance between bottom 18 and plate 11. As shown, the exterior surface of insulation sleeve 64 engages the interior of opening 52.

During crystal growth, the furnace heating chamber is evacuated to between 0.01 to 1 torr, and heated to between 1685° K. and 1735° K. At these temperatures and pressures, it has been found that any carbon (for example, a graphite crucible retainer) and silica (for example, a crucible) in direct contact will react to form gaseous carbon monoxide, CO, which occurs as per the following reactions:

$$SiO_2 + 3C \rightarrow SiC + 2CO \qquad (1)$$

$$SiO_2 + C \rightarrow SiO + CO. \qquad (2)$$

Each of these reactions is both pressure and temperature dependent. In the range of pressures and temperatures encountered in silicon crystal growth, the pressures of reactions (1) and (2) are, respectively:

$$\log P = 11.62 - 1.57 \times 10^4 / T \qquad (3)$$

and $$\log p = 12.03 - 1.78 \times 10^4/T \tag{4}$$

where p is the total pressure from the reaction in torr and T is the temperature in degrees Kelvin. Thus, as can be calculated from equations (3) and (4), at the melting point of silicon (T=1685° K.) reactions (1) and (2) will go forward at pressures at and below about 200 and 29 torr respectively.

In an actual environment, the SiC formed in reaction (1) is a condensed species that, once formed, prevents continuing direct contact of graphite and silica and, at pressures above about 4 torr, further generation of CO by reaction (1). At pressures below 4 torr, however, CO will continue to be evolved by reaction(s) between the SiC formed in reaction (1) and the silica ($SiO_2$) crucible.

The SiO produced in reaction (2) is a volatile species and will be removed from the silica-carbon (graphite) interface. Thus, reaction (2) will go forward, towards the right forming CO, at pressures below 30 torr and, at pressures between 4 and 30 torr, will be the controlling reaction for CO formation.

The CO gas, however produced, will be transported from the area in which it produced into crucible 10 and will there react with the silicon in the crucible to form the unwanted impurity silicon carbide (SiC), according to the following equation

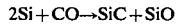

$$2Si + CO \rightarrow SiC + SiO$$

In the illustrated embodiment, the conventional graphite retainer used to support the silica crucible has been replaced by a molybdenum sleeve 9 and disc 11. The only area where silica and graphite (carbon) are in close proximity is near opening 56 where silicon powder prevents direct contact. During heat-up the silicon powder near opening 56 and silicon seed 30 reacts with graphite plug 50 to form silicon carbide which creates a bond between the seed and plug, prevents the seed from floating in liquid silicon of higher density, and prevents further direct contact of graphite and silica. This reaction also seals opening 56 and thereby prevents the leakage of molten silicon. The silicon carbide formed in this area is prevented from contaminating the melt by the presence of the seed 30 above it. In some instances silicon powder may not be used, in which case the base of silicon seed 30 will react with the graphite plug 50 below it and then during heat-up, form a SiC bond and seal.

Thus, no carbon and silica are in contact anywhere within the heating chamber during crystal growth. The silica crucible contacts only molybdenum and silicon, and the graphite heating elements and supports are not in contact with any silica. Therefore, neither reaction (1) nor (2) can proceed; formation of carbon monoxide is prevented; and, hence, substantially no silicon carbide impurities are formed.

OTHER EMBODIMENTS

Retainers of molybdenum, tungsten, tantalum or other refractory materials that are free of elemental carbon may be used in any high temperature crystal growth process, including the Czochralski process and the Heat Exchanger Method, to prevent formation of carbon monoxide and, in the case of silicon or other crystals whose carbides have greater stability than carbon monoxide, the formation of unwanted impurities. The retainers may comprise both a cylinder surrounding the silica crucible and a plate on which the crucible rests, as disclosed; a surrounding cylinder alone; or a single cup-shaped piece into which the silica crucible fits.

In some embodiments, such as that shown in FIG. 2, it may be desirable to use a silica crucible and a graphite retainer, and to coat either the exterior of the silica crucible or the interior of the graphite retainer with a layer of refractory material that is free of elemental carbon. In the FIG. 2 embodiment, a silicon carbide layer 100 about 3 thousandths of an inch thick is provided on the interior of a graphite retainer 102 which supports a silica crucible 10. The silicon carbide layer prevents CO formation at pressures above about 4 torr; at pressures below that a layer of molybdenum, tantalum or tungsten should be used.

What is claimed is:

1. In the process of growing crystals in which material within a silica crucible is heated under conditions of partial vacuum to above the melting point of said material to melt the material and the material is thereafter solidified, and in which a retainer at least partially surrounds, engages and supports said crucible, that improvement comprising: providing a pressure of partial vacuum less than about 30 torr during at least part of the heating and solidification of said material; and, providing surfaces of said crucible and said retainer in engagement with each other such that there is no direct contact between silica and elemental carbon.

2. The process of claim 1 wherein either the interior surface of said retainer or the exterior surface of said crucible is defined by a refractory material free from both elemental carbon and silica.

3. The process of claim 2 wherein the exterior surface of said crucible is defined by said refractory material.

4. The process of claim 2 wherein the interior surface of said retainer is defined by said refractory material.

5. The process of claim 4 wherein said retainer comprises said refractory material.

6. The process of claim 2 wherein said refractory material is chosen from the group consisting of tantalum, tungsten, molybdenum and silicon carbide.

7. The process of claim 1 wherein said pressure is less than about 4 torr and either the exterior surface of the crucible or the interior surface of the retainer is defined by a material chosen from the group consisting of tantalum, tungsten and molybdenum.

8. The process of claim 1 wherein at pressures less than about 30 Torr and temperatures not less than the melting point of said material, the carbide of said material is more stable than carbon monoxide.

9. The process of claim 1 wherein said material is silicon.

10. The process of claim 1 wherein said process is one of the Czochralski process and the Heat Exchanger Method.

11. The process of claim 1 wherein said material is heated within the heating chamber of a furnace and within said heating chamber there is no silica and elemental carbon in direct contact.

12. The process of claim 1 wherein at least one of the interior surface of said retainer and the exterior surface of said crucible is defined by a coating of a refractory material chosen from the group consisting of molybdenum, tantalum, tungsten and silicon carbide.

13. The process of claim 1 wherein said crucible has a generally cylindrical vertical wall and said retainer includes a cylindrical portion surrounding at least a portion of the cylindrical wall of said crucible and a planar portion supporting the base of said crucible.

* * * * *